United States Patent
Bernstein et al.

(10) Patent No.: US 6,954,916 B2
(45) Date of Patent: Oct. 11, 2005

(54) METHODOLOGY FOR FIXING QCRIT AT DESIGN TIMING IMPACT

(75) Inventors: Kerry Bernstein, Underhill, VT (US);
Philip G. Emma, Danbury, CT (US);
Leendert M. Huisman, South Burlington, VT (US); Paul D. Kartschoke, Williston, VT (US);
Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/604,179

(22) Filed: Jun. 30, 2003

(65) Prior Publication Data

US 2004/0267514 A1 Dec. 30, 2004

(51) Int. Cl.[7] ............................................. G06F 17/50
(52) U.S. Cl. .................................. 716/6; 716/4; 716/5
(58) Field of Search .................................... 716/6, 4, 5

(56) References Cited

U.S. PATENT DOCUMENTS

| | | | |
|---|---|---|---|
| 5,396,169 A | 3/1995 | Buehler et al. | 324/158.1 |
| 5,400,270 A | 3/1995 | Fukui et al. | 716/6 |
| 5,671,148 A * | 9/1997 | Urano et al. | 702/65 |
| 5,787,008 A | 7/1998 | Pullela et al. | 716/6 |
| 5,850,145 A | 12/1998 | Burroughs et al. | 324/751 |
| 5,936,867 A | 8/1999 | Ashuri | 716/6 |
| 5,974,247 A | 10/1999 | Yonezawa | 716/6 |
| 5,982,691 A | 11/1999 | Shabde et al. | 365/206 |
| 6,041,169 A | 3/2000 | Brennan | 716/6 |
| 6,090,152 A | 7/2000 | Hayes et al. | 716/6 |
| 6,204,516 B1 | 3/2001 | Shabde et al. | 257/48 |
| 6,249,901 B1 | 6/2001 | Yuan et al. | 716/5 |
| 6,253,352 B1 | 6/2001 | Hanriat et al. | 716/4 |
| 6,304,998 B1 | 10/2001 | Kamiya et al. | 716/4 |
| 6,351,151 B2 * | 2/2002 | Kumar et al. | 326/98 |
| 6,608,512 B2 * | 8/2003 | Ta et al. | 327/211 |
| 2003/0234430 A1 * | 12/2003 | Friend et al. | 257/428 |
| 2004/0168134 A1 * | 8/2004 | Prasad | 716/1 |

OTHER PUBLICATIONS

McPartland, "Circuit Simulations of Alpha–Particle–InducedSoft Errors in MOS Dynamic RAMs" Feb. 1981, IEEE Journal of Solid State Circuits, vol. 16, iss. 1, pp. 31–34.*

Lage et al., "Soft Error Rate and Stored Charge Requirements in Advanced High–Density SRAMS", Dec. 1993, IEEE Internation Electron Devices Meeting, Technical Digest, pp. 821–824.*

Anghel et al., "Evaluation of a Soft Error Tolerance Technique Based on Time and/or Space Redundancy", Sep. 2000, IEEE 13 Symposium on Integrated Circuits and Systems Designs, pp. 237–242.*

Degalahal et al., "Analyzing Soft Errors in Leakage Optimized SRAM Design", Jan. 2003, IEEE 16th International Conference on VLSI Design, Proceedings, pp. 227–233.*

(Continued)

*Primary Examiner*—Matthew Smith
*Assistant Examiner*—Sun James Lin
(74) *Attorney, Agent, or Firm*—Scully, Scott, Murphy & Presser; Richard A. Henkler

(57) ABSTRACT

A method and system for simulating an integrated circuit. The method includes the steps of performing a timing analysis of the circuits to ensure that they meet specified timing criteria, performing soft error analysis of the circuits to determine whether they meet specified soft error criteria, and improving those circuits that fail the soft error analysis to improve their resistance to soft errors and having no degradation on timing. Preferably, the improving step includes the step of improving those circuits that fail the soft error analysis by either having an additional voltage source or altering the capacitance of the circuits.

16 Claims, 4 Drawing Sheets

OTHER PUBLICATIONS

Nguyen et al., "A Systematic Approach to SER Estimation and Solutions", Apr. 2003, IEEE 41$^{st}$ Annual International Reliability Physics Symposium Proceedings, pp. 60–70.*

Chan, Technique for Reducing Personalized Array Soft Errors', Research Disclosure, Kenneth Mason Publications Ltd, England, Oct. 1989, No. 306.

Jarvela, et al., "MLC Design to Limit Soft Error Fails", IBM Technical Disclosure Bulletin, vol. 27, No. 2, Jul. 1984, pp. 1343–1344.

Geppert et al., "CMOS DRAM Design Layout to Improve Soft Error Immunity", IBM Technical Disclosure Bulletin, vol. 34, No. 4B, Sep. 1991, pp. 27–28.

Dai, et al., "Alpha–SER Modeling & Simulation for Sub–0.25$\mu$m CMOS Technology", 1999 Symposium on VLSI Technology Digest of Technical Papers, pp. 81–82.

* cited by examiner

EXAMPLE OF LOGIC CIRCUIT (Prior Art)

```
Port:
  INPUT : A, B:
  OUTPUT: C
EndPort
Net:
  Net-1: pA, Xpa;
  Net-2: pB, Ypb;
  Net-3: Xpb, Ypa;
  Net-4; pC, Ypc;
EndNet;
```

EXAMPLE OF NET LIST (Prior Art)

METHODOLOGY FOR FIXING QCRIT AT DESIGN TIMING IMPACT

BACKGROUND OF INVENTION

1. Field of the Invention

The present invention generally relates to the design of integrated circuits. More specifically, the invention relates to reducing the failure rates of the nets of an integrated circuit due to soft errors without impacting the timing on critical paths of the circuit.

2. Background Art

With the continuing and increasing demand for electronic devices of all kinds, there is a concurrent need to improve the quality and to reduce the manufacturing time of these devices. In general, all electronic devices include at least one integrated circuit ("IC") or "chip" which integrates millions of transistors and connections on one tiny substrate of semiconductor material. The miniaturization of integrated circuits, and the products which they control, continues to be of major significance in the marketplace and a driving force to the manufacturers of such products.

In designing integrated circuits, there are several key criteria which need to be optimized with respect to each other in order to create a design and an on-chip layout for an integrated circuit that provides the best overall results within certain cost and other design constraints. Such criteria include the size of the chip, power consumption of the chip and the speed of operation for the various functions accomplished within the chip. This kind of optimization analysis is normally done on a workstation or other computer system running various analysis and design programs which, in turn, operate to weigh the relative significance of the various design criteria for each specific application in which the designed integrated circuit will be implemented.

One of the most important of these design criteria is the time delay involved in a particular design for a digital signal to travel through a particular path or paths on the integrated circuit to get to certain key points or nodes of the circuit in the minimum time possible consistent with performance requirements. Ideally, the best design of an integrated circuit is the design that enables a signal to traverse a predetermined layout between certain key points in the smallest amount of time, wherein the layout or integrated circuit consumes minimal power and requires the smallest amount of semiconductor area to implement. In most cases, these criteria are mutually conflicting so that one cannot be improved without decreasing the efficacy of another at least to some extent.

For example, in the "sizing" of particular transistors for a proposed integrated circuit design, it is noted that although increasing the area of the transistors in the design will, in general, decrease the time delay in signal transmission, it will also increase the size and power of the chip, and therefore limit the applicability of the chip in certain product areas, as well as reduce the rofitability of the chip. Also, decreasing the size of a chip will, in general, decrease its power consumption, heat generation and chip signal interference.

Another important consideration is the selection of Qcrit for each net of the chip. Qcrit is the amount of charge that will cause a logic state reversal of the latch by causing a sufficiently large voltage disturbance. In the case of a DRAM cell, Qcrit is the amount of charge that will cause a logic state reversal by causing a sufficiently large leakage current to flow that will discharge the storage capacitor. Unfortunately, both miniaturization and lowered operating voltage (for example, the migration to 3.3 volt and beyond devices) of SRAM and DRAM cells with higher integration densities also reduce the value of Qcrit for stable operation of the memory cells. Accordingly, SRAMs and DRAMs have become increasingly vulnerable to errors of the type that are referred to as soft errors.

Soft errors in memory components used in digital components are spontaneous errors or changes in information stored in the memories that cannot be reproduced. Soft errors in electronic components are caused by a variety of electrical noise sources. For example, exposure to high energy particles, including particles produced by radioactivity or extraterrestrial cosmic rays, causes soft errors in electronic components.

The priority of each of the above design constraints and others, and the best possible solution for a particular application, will depend upon the application in which the integrated circuit is to be used. In most cases, the best result is obtained through a combination of trade-offs that is optimized with specific regard to, and consideration of, the specific application for the integrated circuit being designed.

In order to determine the level of optimization and evaluate the effectiveness of any particular design, certain analyses have been used in the industry. One such general evaluation technique is timing analysis. In this analysis, a circuit timing simulator evaluates a circuit (or macro, or chip) and produces a slack list. The slack list is a list of all nets in the system ordered by their timing difference from a predetermined nominal time. Those nets that are at or above their allocated timing are said to be "timing critical." Those nets that are well within their allocated timing are not timing critical. In design iterations, those nets that meet their timing are left alone, and those nets that are over their allocated timing require redesign (and possible re-implementation at the logic level). Once all nets are on or under target, the design iteration process ends. While this procedure may effectively address circuit times, it is believed that, at least for many applications, these prior art procedures may not effectively address Qcrit.

SUMMARY OF INVENTION

An object of this invention is to improve methodologies for the design of integrated circuits.

Another object of the present invention is to provide a method and system for improving the Qcrit of an IC without adversely affecting the timing of critical paths in the circuit.

A further object of the invention is to look at each net within an IC chip and, if the net is on a critical path and the Qcrit of the net is below a set criteria, to improve the Qcrit without impacting timing.

These and other objectives are attained with a method and system for simulating an integrated circuit. The method including the steps of performing a timing analysis of the circuits included in the integrated circuit to ensure that they meet specified timing criteria, performing soft error analysis of the circuits to determine whether they meet specified soft error criteria, and those circuits that fail the soft error analysis to improve their resistance to soft errors. Preferably, the improving step includes the step of improving those circuits that fail the soft error analysis by either having an additional voltage source or altering the capacitance of the circuits.

Further benefits and advantages of the invention will become apparent from a consideration of the following detailed description, given with reference to the accompanying drawings, which specify and show preferred embodiments of the invention.

DETAILED DESCRIPTION

Figure 1:
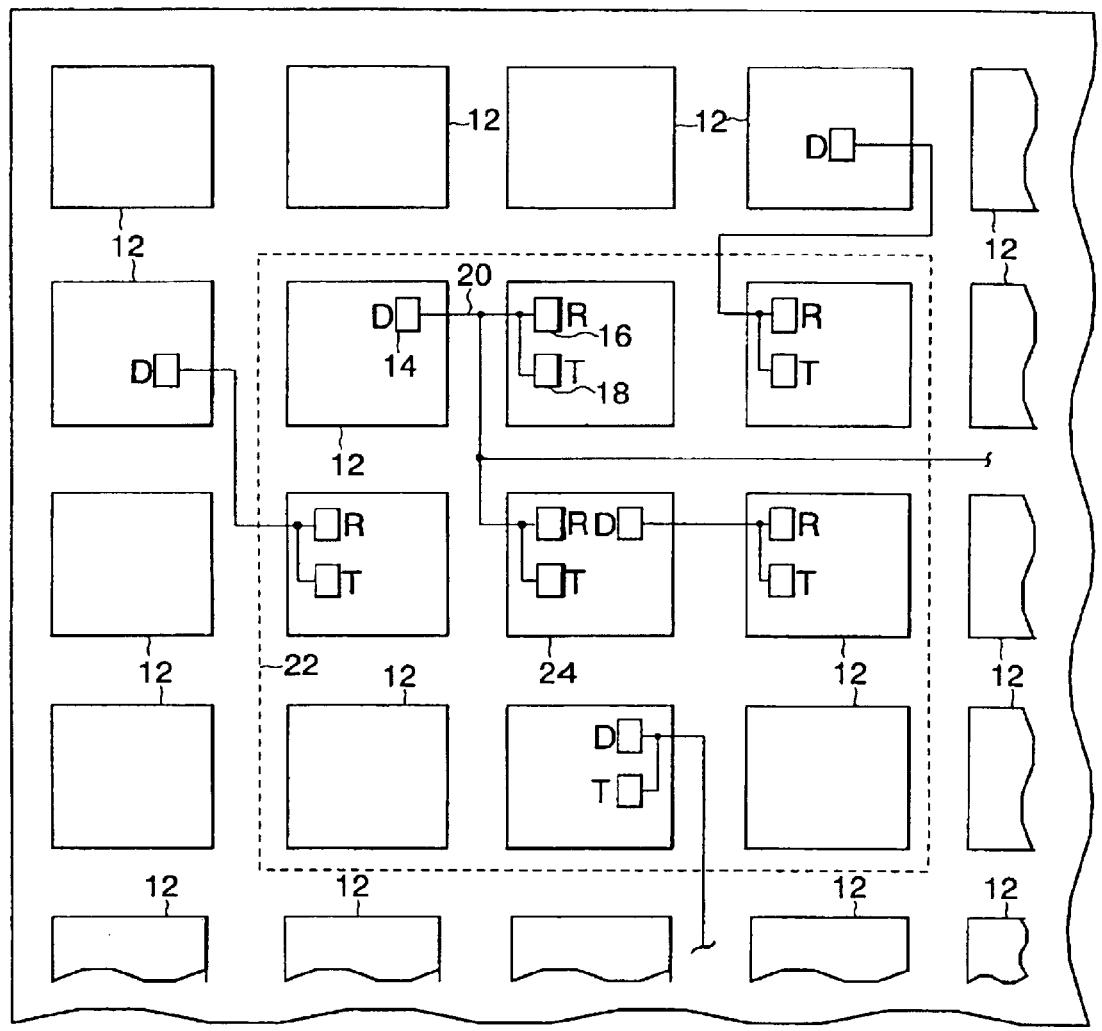
FIG. 1 is a block diagram illustrating a portion of a module having multiple integrated circuits.

The present invention generally relates to the design of integrated circuits, and more specifically, to reducing the failure rate of the nets of an integrated circuit due to soft errors without impacting the timing of critical nets of the circuit. FIG. 1 illustrates circuits of the type with which this invention may be used. More specifically, FIG. 1 illustrates a portion of a module 10 having a plurality of integrated circuit chips, shown generally at reference numeral 12. At least some of the chips 12 include logic devices such as drivers (D) 14 and receivers (R) 16. Also on the chips 12 are non-logic devices such as terminators (T) 18. The drivers 14 are connected to the receivers 16 by means of lines 20. The chips 12 are interrelated with each other and may be interrelated with chips on another module, not shown. Thus, drivers 14 and terminators 18 may be not only off-chip, but also off-module.

Figures 2, 3:
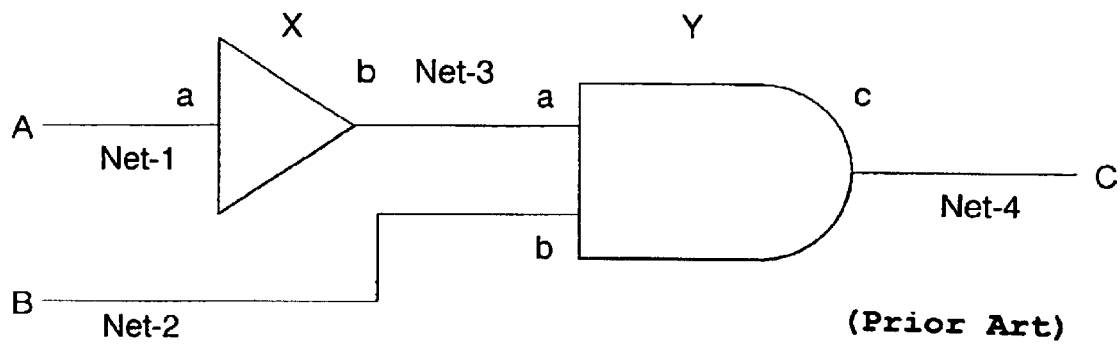
FIG. 2 shows an example of a logic circuit.
FIG. 3 gives an example of a net list for the circuit illustrated in FIG. 2.

FIG. 2 shows an example of one logic circuit of one of the chips of FIG. 1, and FIG. 3 gives an example of a net list for the circuit of FIG. 2. In the logic circuit example shown in FIG. 2, cell X and cell Y are connected between the logic circuit input terminals A, B and the output terminal C. Cell X comprises input terminal b (port) and output terminal b, while cell Y comprises input terminals a, b and output terminal c. These are connected respectively to wires Net-1-Net-4. The net list for the logic circuit example illustrated in FIG. 2 is recorded as shown in FIG. 3, for example. The input terminal and output terminal ports (Port) are A, B, and C, and these ports are recorded as pA, pB, pC, while the input terminals and output terminals for each cell are recorded as Xpa, Ypb, and so on.

As mentioned previously, in the design of integrated circuits, a number of factors are important, including timing. To achieve proper timing, a circuit timing simulator may be used to evaluate a circuit (or macro, or chip) and to produce a slack list. The slack list is a list of all nets in the system ordered by their timing difference from a predetermined nominal time. Those nets that are at or above their allocated timing are said to be "timing critical." Those nets that are well within their allocated timing are not timing critical. In design iterations, those nets that meet their timing are left alone, and those nets that are over their allocated timing require redesign (and possible re-implementation at the logic level). Once all nets are on or under target, the design iteration process ends.

Figure 4:
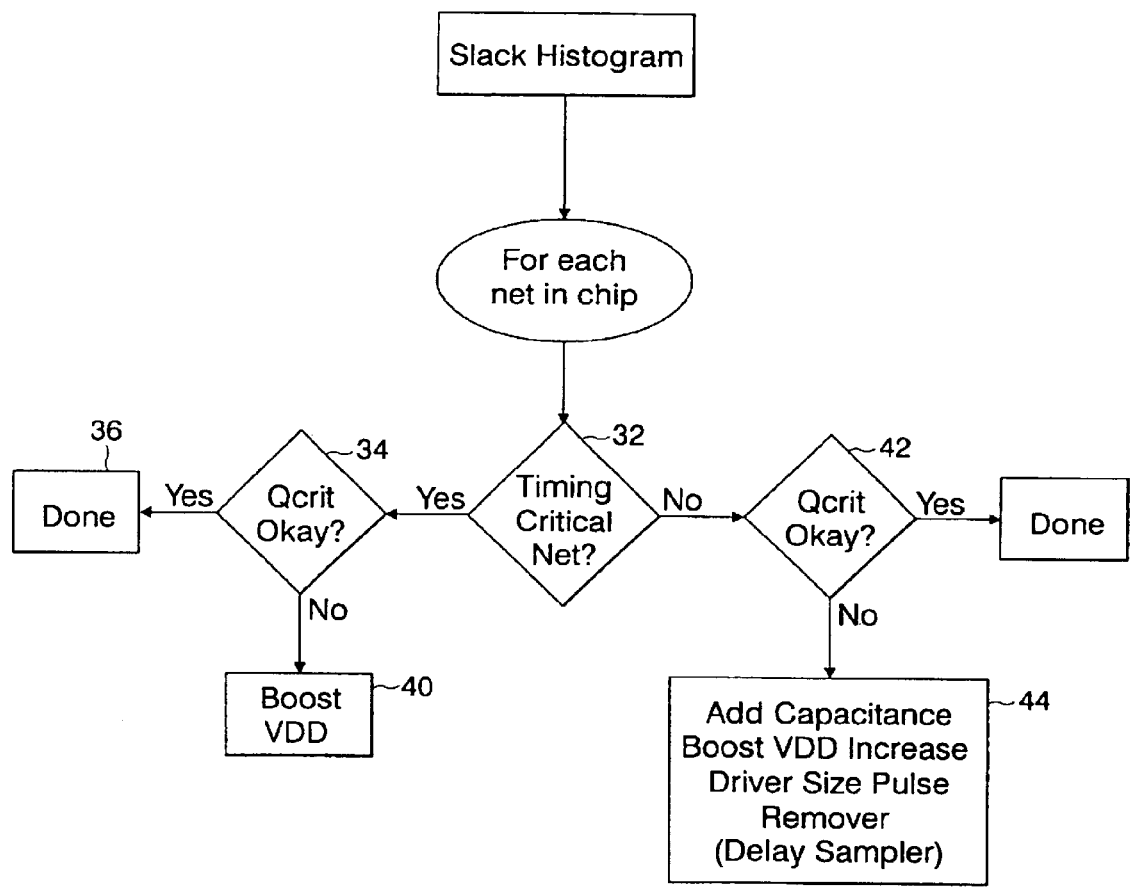
FIG. 4 is a flow diagram showing the preferred circuit design methodology of this invention.

The present invention extends this methodology to include a subsequent filter based on Qcrit analysis. With reference to FIG. 4, once timing is done, each path is determined whether it is timing critical based upon a product's frequency goals. If a timing net is deemed non-critical at 32, then the Qcrit net is applied to the net. For nets that are not timing critical, Qcrit can be improved in various ways, as represented by step 44. For example, Vdd can be boosted on the exposed devices, or Qcrit can be raised by adding capacitance or by other circuit techniques that will slow the net down. When a net that is not timing critical is slowed down to fix Qcrit, its timing must be re-evaluated to ensure that it still meets timing requirements.

For nets deemed timing critical at 32, a similar Qcrit analysis is done at 34.

For all nets having satisfactory soft error immunity (sufficient Qcrit) the process ends, as represented at 36. If the timing critical net needs additional Qcrit, the voltage is boosted on that net at step 40.

In the preferred embodiment, for each net that needs better soft error immunity, Qcrit is improved in one of several ways depending on whether the net is timing critical or not. In one embodiment, an additional voltage source, Vdd'>Vdd, is available or is provided that will make a minimal device size immune. For timing critical nets, either the entire circuit is redesigned (and the timing iteration is begun again), or Vdd is boosted for only those devices subject to soft errors.

Figure 5:
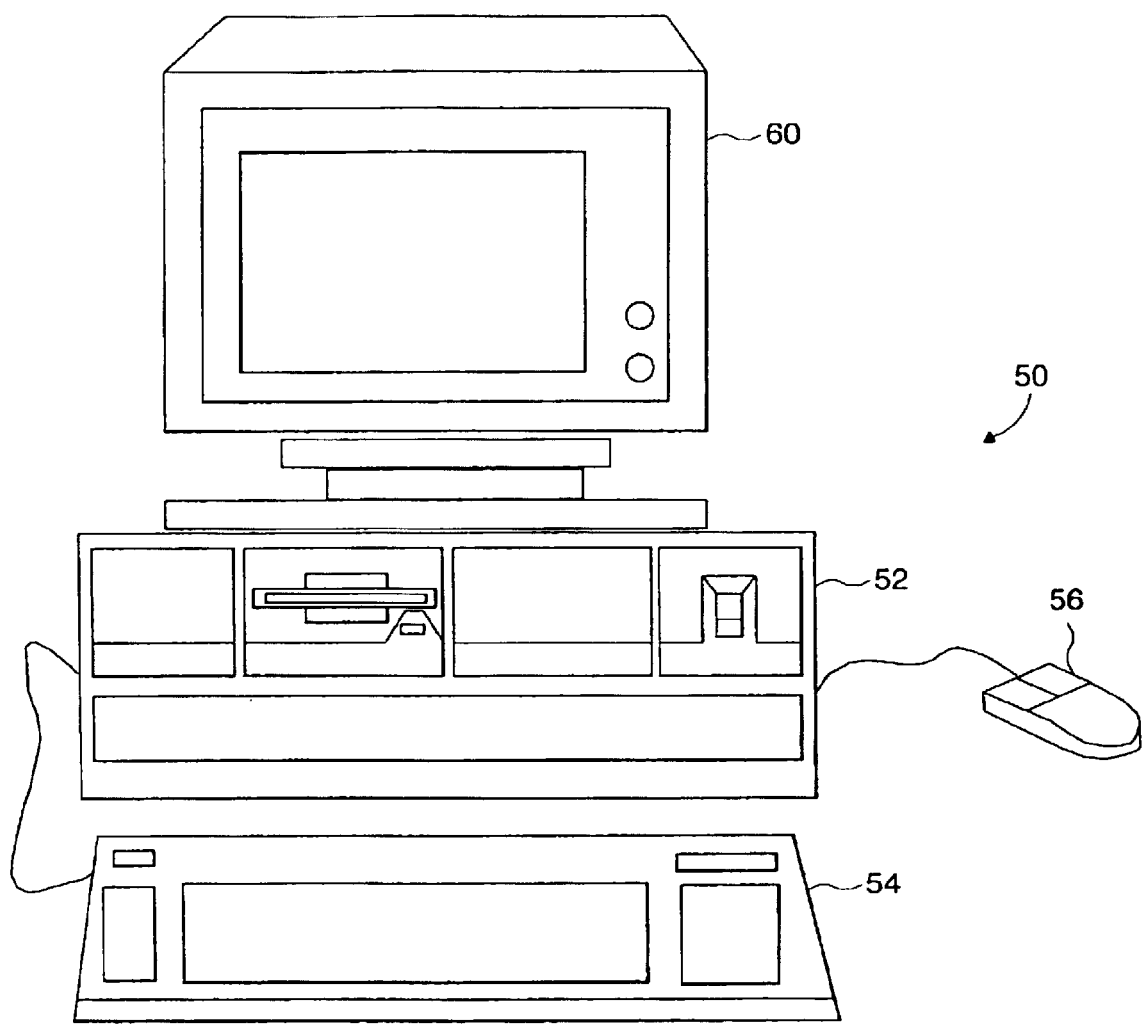
FIG. 5 illustrates a computer that may be used in the practice of this invention.

The method and apparatus of the present invention aid in the design of integrated circuits. In practical terms, the design of very large scale integrated circuits is performed on a computer utilizing computer software. The physical apparatus required for the present invention is illustrated in FIG. 5. Examples include but are not limited to personal computers and workstations such as the IBM RISC System/600™. A personal computer 50 includes a number of interconnecting components. A system unit 52 is coupled to a keyboard 54, a mouse 56 and a monitor 60. Those skilled in the art are aware of the conventional components of the system unit. These conventional components include hard disk drives, one or more central processing units, high speed cache and standard memory, modems, and/or local area networks, interfaces, etc. In addition the system unit 52 contains an operating system, such as UNIX.TM or IBM OS/2™.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of improving the design of an integrated circuit having a multitude of nets, the method including the steps of:

a) performing a timing analysis of the nets to identify which ones of said nets are timing critical and which ones of said nets are not timing critical;

b) performing a soft error analysis of the nets to determine which ones of said nets that are not timing critical are at risk to soft error;

c) implementing design changes to reduce the risk to soft errors to said nets that are determined to be at risk to soft errors; and d) after the implementing step iteratively performing the timing analysis to determine whether the nets identified in step (a) as not timing critical, and determined in step (b) as at risk to soft error, are still not timing critical.

2. A method according to claim 1, wherein the implementing step includes the step of improving those circuits that fail the soft error analysis by either having an additional voltage source or altering the capacitance of the circuits.

3. A method according to claim 1, wherein, for each of a defined set of circuits, the step of performing soft error analysis is done after the step of performing a timing analysis.

4. A method according to claim 1, further comprising the step of, after the step of iteratively performing a timing analysis, performing a further soft error analysis of the improved circuits to determine whether the improved circuits now meet the soft error criteria.

5. A method according to claim 4, further comprising the step of further improving those circuits that fail the further soft error analysis to further improve their resistance to soft errors.

6. A method according to claim 1, wherein the implementing step includes the step of:
using a first defined procedure to improve the resistance to soft errors of those nets that are not timing critical and that fail the soft error analysis; and
using a second defined procedure to improve the resistance to soft errors of those nets that are timing critical and that fail the soft error analysis.

7. A method of simulating an integrated circuit, the method including the steps of:
performing a timing analysis of each of circuits included in the integrated circuit to ensure that they meet specified timing criteria;
performing soft error analysis of each of the circuits to determine whether they meet specified soft error criteria;
improving those circuits that fail the soft error analysis to improve their resistance to soft errors;
after the improving step, performing a further timing analysis of the improved circuits to determine whether the improved circuits still meet the specified timing criteria;
after the step of performing a further timing analysis, performing a further soft error analysis of the improved circuits to determine whether the improved circuits now meet the soft error criteria; and
further improving those circuits that fail the further soft error analysis to further improve their resistance to soft errors;
wherein the further improving step includes the step of further improving those circuits that fail the further soft error analysis using one of two defined procedures depending on whether the circuits pass or fail the further timing analysis.

8. A method according to claim 7, wherein:
for those circuits that fail both the further timing analysis and the further soft error analysis, the step of further improving the circuits includes the step of increasing the voltage applied to the circuits; and
for those circuits that pass the further timing analysis and fail the further soft error analysis, the step of further improving the circuits includes the step of increasing the capacitance of the circuits.

9. A method of simulating an integrated circuit, the method including the steps of:
performing a timing analysis of each of circuits included in the integrated circuit to ensure that they meet specified timing criteria;
performing soft error analysis of each of the circuits to determine whether they meet specified soft error criteria;
improving those circuits that fail the soft error analysis to improve their resistance to soft errors;
after the improving step, performing a further timing analysis of the improved circuits to determine whether the improved circuits still meet the specified timing criteria;
after the step of performing a further timing analysis, performing a further soft error analysis of the improved circuits to determine whether the improved circuits now meet the soft error criteria;
further improving those circuits that fail the further soft error analysis to further improve their resistance to soft errors; wherein:
a first set of circuits fail the further timing analysis and fail the further soft error analysis;
a second set of circuits pass the further timing analysis and fail the further soft error analysis;
the step of further improving those circuits that fail the further soft error analysis includes the steps of
i) using one of a first set of defined procedures to further improve the first set of circuits, and
ii) using one of a second set of defined procedures to further improve the second set of circuits.

10. A system for improving the design of an integrated circuit having a multitude of nets, the system including:
timing analyzer means for performing a timing analysis of the nets to identify which ones of said nets are timing critical and which ones of said nets are not timing critical;
soft error analyzer means for performing a soft error analysis of the nets to determine which ones of said nets that are not timing critical are at risk to soft error;
means for implementing design changes to reduce the risk to soft errors to said nets that are determined to be at risk to soft errors; and
means for iteratively performing the timing analysis, after said design changes are implemented, to determine whether the nets identified by the timing analyzer means as not timing critical, and determined by the soft error analyzer means as at risk to soft error, are still not timing critical.

11. A system according to claim 10, wherein the implementing means includes means for improving those circuits that fail the soft error analysis by either having an additional voltage source or altering the capacitance of the circuits.

12. A system according to claim 10, wherein, for each of a defined set of circuits, the soft error analysis is done after the timing analysis.

13. A program storage device readable by machine, tangibly embodying a program of instructions executable by the machine to perform method steps for improving the design of an integrated circuit having a multitude of nets, said method steps including:
a) performing a timing analysis of the nets to identify which ones of said nets are timing critical and which ones of said nets are not timing critical;
b) performing a soft error analysis of the nets to which ones of said nets that are not timing critical are at risk to soft error;
c) implementing design changes to reduce the risk to soft errors to said nets that are determined to be at risk to soft errors; and
d) after the implementing step, iteratively performing the timing analysis to determine whether the nets identified in step (a) are not timing critical, and determined in step (b) as at risk to soft error, are still not timing critical.

14. A program storage device according to claim 13, wherein the implementing step includes the step of improving those circuits that fail the soft error analysis by either having an additional voltage source or altering the capacitance of the circuits.

15. A program storage device according to claim 13, wherein said method steps further comprise the step of, after the step of iteratively performing the timing analysis, performing a further soft error analysis of the improved circuits to determine whether the improved circuits now meet the soft error criteria.

16. A program storage device according to claim 15, wherein said method steps further comprise the step of further improving those circuits that fail the further soft error analysis to further improve their resistance to soft errors.

* * * * *